(12) United States Patent
Takida (10) Patent No.: US 11,683,017 B2
(45) Date of Patent: Jun. 20, 2023

(54) CLASS-D AMPLIFIER

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Takayuki Takida, Edogawa Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/388,376

(22) Filed: Jul. 29, 2021

(65) Prior Publication Data
US 2022/0094311 A1    Mar. 24, 2022

(30) Foreign Application Priority Data
Sep. 18, 2020  (JP) .............................. JP2020-157752

(51) Int. Cl.
*H03F 3/217* (2006.01)
*H03F 1/02* (2006.01)
*H03F 3/185* (2006.01)

(52) U.S. Cl.
CPC ......... *H03F 3/2171* (2013.01); *H03F 1/0244* (2013.01); *H03F 3/185* (2013.01); *H03F 2200/03* (2013.01)

(58) Field of Classification Search
CPC ...... H03F 3/2171; H03F 1/0244; H03F 3/185; H03F 2200/03; H03F 2200/33; H03F 2200/351; H03F 2200/391; H03F 1/0277; H03F 3/2173

USPC ........................................ 330/10, 207 A, 251
See application file for complete search history.

(56) References Cited

U.S. PATENT DOCUMENTS

| | | | |
|---|---|---|---|
| 6,587,670 B1 | 7/2003 | Hoyt et al. | |
| 6,768,376 B2 | 7/2004 | Hoyt et al. | |
| 7,157,968 B2 * | 1/2007 | Shin ....................... | H03F 1/523 330/251 |
| 10,511,263 B2 | 12/2019 | Høyerby | |
| 2009/0010457 A1 | 1/2009 | Munenaga et al. | |
| 2018/0241363 A1 | 8/2018 | Kiyono | |
| 2018/0331660 A1 | 11/2018 | Høyerby | |

(Continued)

FOREIGN PATENT DOCUMENTS

| | | |
|---|---|---|
| JP | H03-289204 A | 12/1991 |
| JP | 2000-196376 A | 7/2000 |

(Continued)

*Primary Examiner* — Hieu P Nguyen
(74) *Attorney, Agent, or Firm* — Allen & Overy LLP (57) ABSTRACT

According to one embodiment, a class-D amplifier including: a PWM modulator that outputs a PWM modulation signal in response to an input signal; and a drive circuit that amplifies the PWM modulation signal, and supplies it to an output end. The drive circuit includes: a first output transistor whose main current path is connected between a power source supplying end and the output end; a second output transistor having a size larger than a size of the first output transistor; and a resistance element that is connected between the main current path of the first output transistor and the output end.

17 Claims, 7 Drawing Sheets

(56) References Cited

U.S. PATENT DOCUMENTS

2019/0381798 A1 12/2019 Ueda et al.
2021/0265959 A1* 8/2021 Lee .......................... H03F 3/72

FOREIGN PATENT DOCUMENTS

| JP | 2004-146981 A | 5/2004 |
| JP | 2008-154117 A | 7/2008 |
| JP | 6248416 B2 | 12/2017 |
| JP | 2018-191295 A | 11/2018 |
| JP | 6682463 B2 | 4/2020 |
| WO | 2006/087870 A1 | 8/2006 |

* cited by examiner

CLASS-D AMPLIFIER

CROSS-REFERENCE TO RELATED APPLICATIONS

This application is based upon and claims the benefit of priority from Japanese Patent Application No. 2020-157752, filed on Sep. 18, 2020; the entire contents of which are incorporated herein by reference.

FIELD

Embodiments described herein relate generally to a class-D amplifier.

BACKGROUND

Conventionally, there has been disclosed a technology that changes, in a drive circuit of a class-D amplifier, an output transistor to be operated in accordance with a signal level of an input signal. There has been made an attempt to reduce loss of electric power by using a small-sized output transistor when a signal level is small and further by switching into a large-sized output transistor when the signal level is large. When the number of output transistors having different sizes is increased, fine-grained control according to a signal level is achieved to be able to reduce loss of electric power. However, when the number of output transistors is increased, a size of a circuit constituting a class-D amplifier is accordingly increased, thereby leading to increase in cost. Thus, there has been desired a class-D amplifier that is capable of effectively reducing loss of electric power while preventing increase in cost.

DETAILED DESCRIPTION

According to one embodiment, a class-D amplifier comprising: a PWM modulator that outputs a PWM modulation signal in response to an input signal; a drive circuit that amplifies the PWM modulation signal, and outputs an amplified PWM modulation signal; and an output end to which the amplified PWM modulation signal from the drive circuit is supplied, wherein the drive circuit includes: a first output transistor whose main current path is connected between a power source supplying end and the output end; a second output transistor having a size larger than a size of the first output transistor and whose main current path is connected between the power source supplying end and the output end; and a resistance element that is connected between the main current path of the first output transistor and the output end.

Exemplary embodiments of a class-D amplifier will be explained below in detail with reference to the accompanying drawings. The present invention is not limited to the following embodiments.

First Embodiment

Figure 1:
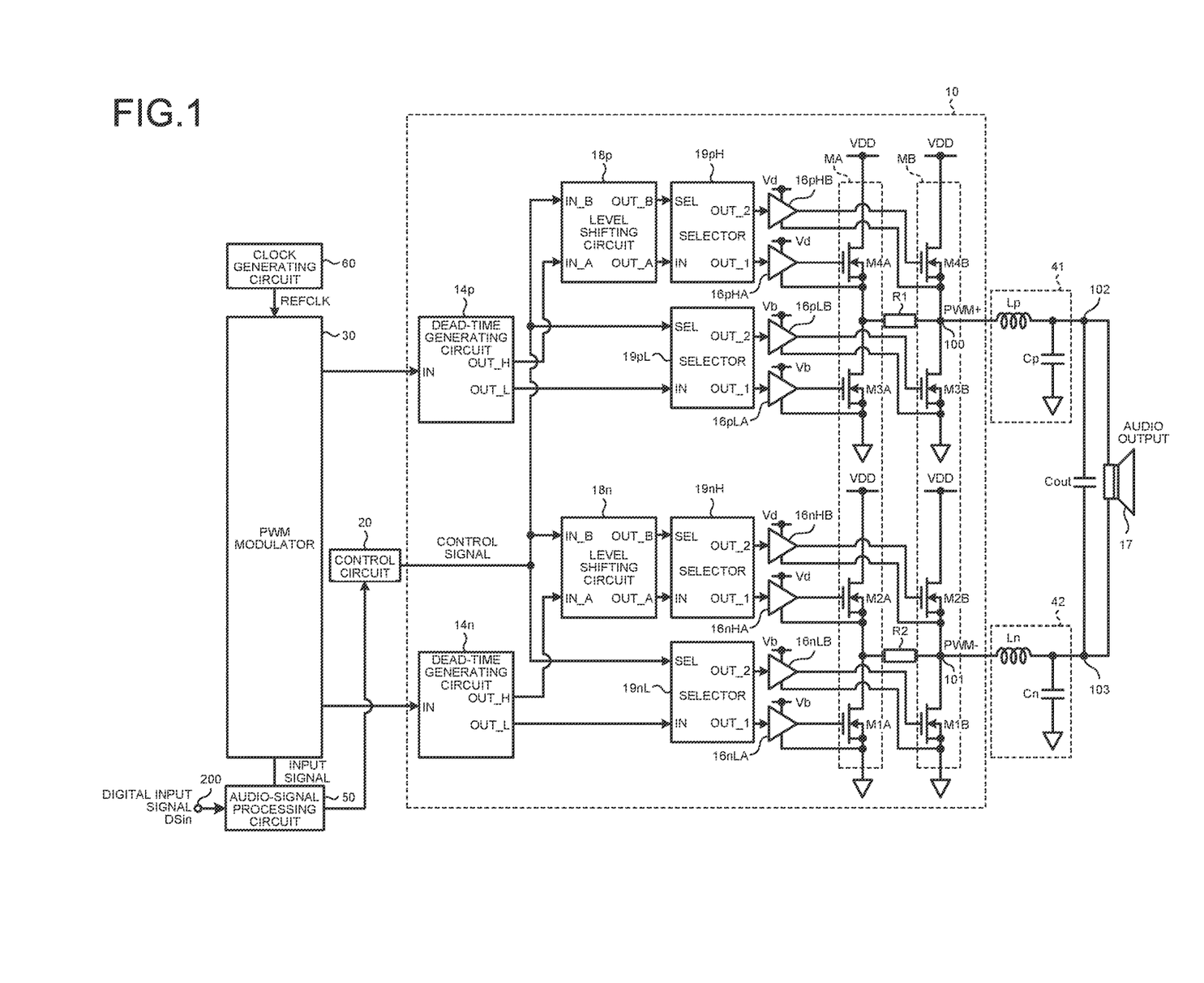
FIG. 1 is a diagram illustrating a configuration of a class-D amplifier according to a first embodiment.

FIG. 1 is a diagram illustrating a configuration of a class-D amplifier according to a first embodiment. In the present embodiment, there are provided a drive circuit 10, a control circuit 20, a PWM modulator 30, and an audio-signal processing circuit 50. The audio-signal processing circuit 50 generates, for example, in accordance with a signal level of a digital input signal DSin supplied to an input end 200, a signal for changing an output transistor to be operated in the drive circuit 10, and further outputs the generated signal. Also, the audio-signal processing circuit 50 executes a predetermined process on the input signal DSin so as to supply an input signal to the PWM modulator 30.

In response to an output signal of the audio-signal processing circuit 50, the control circuit 20 generates a control signal for controlling an operation state of the drive circuit 10, and further supplies the generated signal to the drive circuit 10. The control circuit 20 sets to an operation mode (hereinafter, may be referred to as small-signal mode) for operating a first transistor group MA alone, or sets to an operation mode (hereinafter, may be referred to as large-signal mode) for operating a second transistor group MB. When setting to the small-signal mode, the control circuit 20 outputs a control signal having a low level (hereinafter, may be referred to as L level), for example, and when setting to the large-signal mode, outputs a control signal having a high level (hereinafter, may be referred to as H level), for example.

In response to a reference clock signal REFCLK supplied from a clock generating circuit 60 and an input signal supplied from the audio-signal processing circuit 50, the PWM modulator 30 supplies a PWM pulse of a positive phase to a dead-time generating circuit 14p, and further supplies a PWM pulse of a reversed phase to a dead-time generating circuit 14n. A configuration of the PWM modulator 30 is disclosed in Japanese Patent No. 6682463, for example.

The drive circuit 10 includes the dead-time generating circuits 14p and 14n. The dead-time generating circuit 14p sets a dead time for a PWM pulse of a positive phase, outputs a high-side PWM pulse of a positive phase from an OUT_H end thereof, and outputs a low-side PWM pulse of a positive phase from an OUT_L end thereof. This is for preventing a case where output transistors M3A and M4A of the first transistor group MA and output transistors M3B and M4B of the second transistor group MB are simultaneously turned on and thus flow-through current flows.

Similarly, the dead-time generating circuit 14n sets a dead time for a PWM pulse of a reversed phase, outputs a high-side PWM pulse of a reversed phase from an OUT_H end thereof, and outputs a low-side PWM pulse of a reversed phase from an OUT_L end thereof. This is for preventing a case where output transistors M1A and M2A and output transistors M1B and M2B are simultaneously turned on and thus flow-through current flows.

The drive circuit 10 includes level shifting circuits 18p and 18n. In the level shifting circuit 18p, a high-side PWM pulse of a positive phase is supplied to an IN_A end thereof, and a control signal is supplied to an IN_B end thereof. The level shifting circuit 18p supplies, from an OUT_A end thereof to an IN end of a selector 19pH, a signal obtained by level-shifting a high-side PWM pulse of a positive phase to a predetermined level. The level shifting circuit 18p supplies, from an OUT_B end thereof to an SEL end of the selector 19pH, a signal obtained by level-shifting a control signal to a predetermined level.

In the level shifting circuit 18n, a high-side PWM pulse of a reversed phase is supplied to an IN_A end, and a control signal is supplied to an IN_B end. The level shifting circuit 18n supplies, from an OUT_A end thereof to an IN end of a selector 19nH, a signal obtained by level-shifting a high-side PWM pulse of a reversed phase to a predetermined level. The level shifting circuit 18n supplies, from an OUT_B end thereof to an SEL end of the selector 19nH, a signal obtained by level-shifting a control signal to a predetermined level.

The drive circuit 10 includes selectors 19pH, 19pL, 19nH, and 19nL. Output from an OUT_2 end of the selector 19pH is supplied to a gate driver 16pHB. The gate driver 16pHB amplifies an output signal from an OUT_2 end of the selector 19pH so as to supply the amplified signal to a gate of the output transistor M4B. Output from an OUT_1 end of the selector 19pH is supplied to a gate driver 16pHA. The gate driver 16pHA amplifies an output signal from an OUT_1 end of the selector 19pH so as to supply the amplified signal to a gate of the output transistor M4A. The gate drivers 16pHA and 16pHB are biased by a bias voltage Vd. An H level of output of the gate driver 16pHA is set to equal to or more than a threshold voltage of the output transistor M4A, and is further set to equal to or less than a withstand voltage of a gate of the output transistor M4A, and an L level is set to a voltage equal to or less than the threshold voltage of the output transistor M4A. An H level of output of the gate driver 16pHB is set to equal to or more than a threshold voltage of the output transistor M4B, and is further set to equal to or less than a withstand voltage of a gate of the output transistor M4B, and an L level is set to a voltage equal to or less than the threshold voltage of the output transistor M4A.

Output from an OUT_2 end of the selector 19nH is supplied to a gate driver 16nHB. The gate driver 16nHB amplifies an output signal from the OUT_2 end of the selector 19nH so as to supply the amplified signal to a gate of the output transistor M2B. Output from an OUT_1 end of the selector 19nH is supplied to a gate driver 16nHA. The gate driver 16nHA amplifies an output signal from an OUT_1 end of the selector 19nH so as to supply the amplified signal to a gate of the output transistor M2A. The gate drivers 16nHA and 16nHB are biased by the bias voltage Vd. An H level of output of the gate driver 16nHA is set to a voltage equal to or more than a threshold voltage of the output transistor M2A and equal to or less than a withstand voltage of a gate of the output transistor M2A, and an L level is set to a voltage equal to or less than the threshold voltage of the output transistor M2A. An H level of output of the gate driver 16nHB is set to a voltage equal to or more than a threshold voltage of the output transistor M2B and equal to or less than a withstand voltage of a gate of the output transistor M2B, and an L level is set to a voltage equal to or less than a threshold voltage of the output transistor M2A.

Output from an OUT_2 end of the selector 19pL is supplied to a gate driver 16pLB. The gate driver 16pLB amplifies an output signal from the OUT_2 end of the selector 19pL so as to supply the amplified signal to a gate of the output transistor M3B. A gate driver 16pLA amplifies an output signal from an OUT_1 end of the selector 19pL so as to supply the amplified signal to a gate of the output transistor M3A. The gate drivers 16pLA and 16pLB are biased by a bias voltage Vb. The bias voltage Vb is set to a voltage that is higher than the ground potential by a predetermined voltage.

A control signal is supplied to SEL ends of the selectors 19pL and 19nL. When a control signal having an H level is input, the selectors 19pL and 19nL respectively output, from OUT_2 ends thereof to the gate drivers 16pLB and 16nLB, PWM pulses having been input to IN ends thereof. Thus, on a low side, when a control signal is an L level, the gate drivers 16pLA and 16nLA alone operate, and when a control signal is an H level, the gate drivers 16pLB and 16nLB alone operate. The gate drivers 16pLA, 16pLB, 16nLA, and 16nLB apply respective signals to gates of the output transistors M3A, M3B, M1A, and M1B on the basis of input PWM pulses.

When a control signal is an L level, the gate driver 16pLA drives the output transistor M3A on the basis of a PWM pulse of a positive phase. When a control signal is an L level, a gate driver 16nLA drives the output transistor M1A on the basis of a PWM pulse of a reversed phase. On the other hand, when a control signal is an H level, the gate driver 16pLB drives the output transistor M3B on the basis of a PWM pulse of a positive phase. When a control signal is an H level, a gate driver 16nLB drives the output transistor M1B on the basis of a PWM pulse of a reversed phase.

On a high side, similarly to the low side, the gate drivers 16pHA, 16pHB, 16nHA, and 16nHB are controlled on the basis of a control signal. On the high side, elements have to be driven with reference to a source voltage of an output transistor on a positive phase output end. Therefore, level-shifting is performed not only on a PWM pulse, but also on a control signal.

When a control signal having an H level is input to SEL ends, the selectors 19pH and 19nH respectively output, from OUT_2 ends thereof to the gate drivers 16pHB and 16nHB, PWM pulses having been input to the IN ends thereof. Thus, on a high side, when a control signal is an L level, the gate drivers 16pHA and 16nHA operate, and when a control signal is an H level, the gate drivers 16pHB and 16nHB operate.

The gate drivers 16pHA, 16pHB, 16nHA, and 16nHB respectively apply, to gates of the output transistors M4A, M4B, M2A, and M2B, signals based on PWM pulses. When a control signal is an L level, the gate driver 16pHA drives the output transistor M4A on the basis of a PWM pulse of a positive phase. When a control signal is an L level, the gate driver 16nHA drives the output transistor M2A on the basis of a PWM pulse of a reversed phase. On the other hand, when a control signal is an H level, the gate driver 16pHB drives the output transistor M4B on the basis of a PWM pulse of a positive phase. When a control signal is an H level, the gate driver 16nHB drives the output transistor M2B on the basis of a PWM pulse of a reversed phase.

In response to output signals from the gate drivers 16nLA and 16nHA, the output transistors M1A and M2A complementarily execute operation of turning ON/OFF. Similarly, in response to output signals from the gate drivers 16pLA and 16pHA, the output transistors M3A and M4A complementarily execute operation of turning ON/OFF. Similarly, in response to output signals from the gate drivers 16nLB and 16nHB, the output transistors M1B and M2B complementarily execute operation of turning ON/OFF, and in response to output signals from the gate drivers 16pLB and 16pHB, the output transistors M3B and M4B complementarily execute operation of turning ON/OFF.

A class-D amplifier unit is constituted of the PWM modulator 30 and the drive circuit 10. A connection point between a source of the output transistor M4B and a drain of the output transistor M3B is a positive phase output end 100 of a class-D amplifier unit. A connection point between a source of the output transistor M2B and a drain of the output transistor M1B is a reversed phase output end 101 of the class-D amplifier unit.

A resistance element R1 is arranged between a source of the output transistor M4A and the positive phase output end 100. A resistance element R2 is arranged between the output transistor M2A and the reversed phase output end 101. Resistance values of the resistance elements R1 and R2 are set in accordance with a resistance value of a speaker 17 to be a load that is connected between output ends 102 and 103. For example, when a resistance value of the speaker 17 is several ohms, resistance values of the resistance elements R1 and R2 are set to between hundreds of ohms and thousands of ohms, which is approximately hundred times to thousand times of the resistance value of the speaker 17. For example, when a resistance value of the speaker 17 is 4Ω, resistance values of the resistance elements R1 and R2 are set to 1 kΩ. When resistance values of the resistance elements R1 and R2 are appropriately selected, a current value at a time of a small signal is able to be reduced, so that it is possible to effectively reduce loss of electric power.

A coil Lp and a capacitor Cp that are constituting a low-pass filter 41 are connected to the positive phase output end 100. A coil Ln and a capacitor Cn that are constituting a low-pass filter 42 are connected to the reversed phase output end 101. A capacitor Cout and the speaker 17 are connected in parallel between the output end 102 of the low-pass filter 41 and the output end 103 of the low-pass filter 42.

When a PWM pulse of a positive phase is output in a high-level state, the output transistors M4A and M1A are turned ON, and current flows from the positive phase output end 100 into the reversed phase output end 101 via the speaker 17. When a PWM pulse of a positive phase is output in a low-level state, the output transistors M2A and M3A are turned ON, and current flows from the reversed phase output end 101 into the positive phase output end 100 via the speaker 17. A carrier component is removed from a PWM output PWM+ of a positive phase and a PWM output PWM− of a reversed phase by the low-pass filters 41 and 42, and the speaker 17 is driven by sound signals that appear on both of the output ends 102 and 103 of the capacitor Cout. The speaker 17 outputs a sound signal based on the input sound signals.

According to the first embodiment, when a signal level of an input signal is small, the first transistor group MA alone whose size is small and whose driving capacity is small is selected. When a size (gate width) of a transistor is reduced, a gate capacity becomes small, so that it is possible to reduce loss caused by a gate capacity (gate drive loss). Output current from the output transistors M1A to M4A that are constituting the first transistor group MA is effectively reduced by the resistance elements R1 and R2 that are connected in serial between main current paths of the output transistors M1A to M4A and the positive phase output end 100 and the reversed phase output end 101. In other words, charging and discharging between the low-pass filters 41 and 42 are effectively reduced by the resistance elements R1 and R2. Thus, it is possible to effectively reduce loss of electric power in the small-signal mode. Although loss of electric power is generated by the resistance elements R1 and R2, when current is reduced by the resistance elements R1 and R2, loss of electric power which is proportional to a square of the current is able to be reduced, so that it is possible to effectively reduce loss of electric power.

In the class-D amplifier, voltages at starting of the positive phase output end 100 and the reversed phase output end 101 are set by current flowing via the resistance elements R1 and R2. Therefore, current at starting is reduced by the resistance elements R1 and R2, so that it is possible to reduce, what is called, a pop noise occurring at starting.

When a level of an input signal is large, by a control signal from the control circuit 20, there is switched into a mode in which the second transistor group MB operates. Thus, it is possible to improve driving capacity of the drive circuit 10. At a time of a large signal, power consumption by an ON resistance of an output transistor is a dominant factor of loss of electric power. When a size (gate width) of a transistor is increased, an ON resistance of the transistor is able to be reduced. Therefore, when transistors having sizes larger than those of the output transistors M1A to M4A constituting the first transistor group MA are used as the output transistors M1B to M4B constituting the second transistor group MB, the ON resistance is able to be reduced. Thus, it is possible to reduce loss of electric power in the large-signal mode in which an input-signal level is large. Note that in the large-signal mode according to the present embodiment, the second transistor group MB alone is configured to operate; however, both of the first transistor group MA and the second transistor group MB may be configured to operate.

Figure 2:
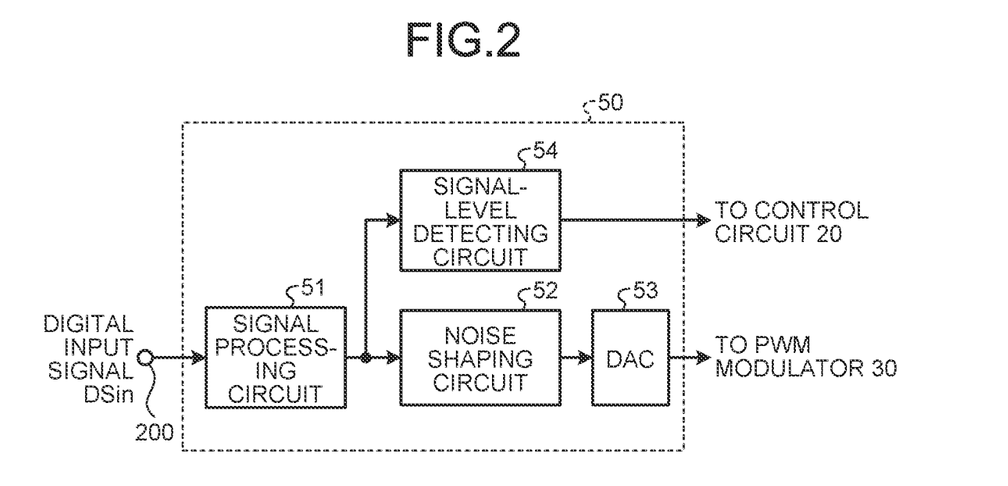
FIG. 2 is a diagram illustrating one embodiment of an audio-signal processing circuit.

FIG. 2 is a diagram illustrating one embodiment of the audio-signal processing circuit 50. The audio-signal processing circuit 50 according to the present embodiment includes a signal processing circuit 51 that receives a signal transmitted from the input end 200, a noise shaping circuit 52, a DAC53, and a signal-level detecting circuit 54. To the input end 200, the digital input signal DSin having a signal format of two's complement representation is supplied, for example. The signal processing circuit 51 constitutes a filter circuit, for example.

An output signal from the signal processing circuit 51 is supplied to the signal-level detecting circuit 54 and the noise shaping circuit 52. The signal-level detecting circuit 54 detects a peak value of the supplied signal level, and compares the detected value with a predetermined threshold value. When the supplied signal level is smaller than the threshold value, a signal of an L-level indicating a small-signal state is generated, which is supplied to the control circuit 20. When the supplied signal level is equal to or larger than the threshold value, a signal of an H level is generated, which is supplied to the control circuit 20. The noise shaping circuit 52 shapes a frequency distribution of a noise component.

An output signal from the noise shaping circuit 52 is supplied to the DAC 53 that is a digital-analog (DA) converting circuit. The DAC 53 converts an output signal from the noise shaping circuit 52 into an analog signal, which is supplied to the PWM modulator 30.

The audio-signal processing circuit 50 according to the present embodiment supplies, to the control circuit 20, a switching signal according to a signal level of the supplied digital input signal DSin. The level is determined by using a digital signal output from the signal processing circuit 51, and thus accuracy of level determination is able to be improved.

Figure 3:
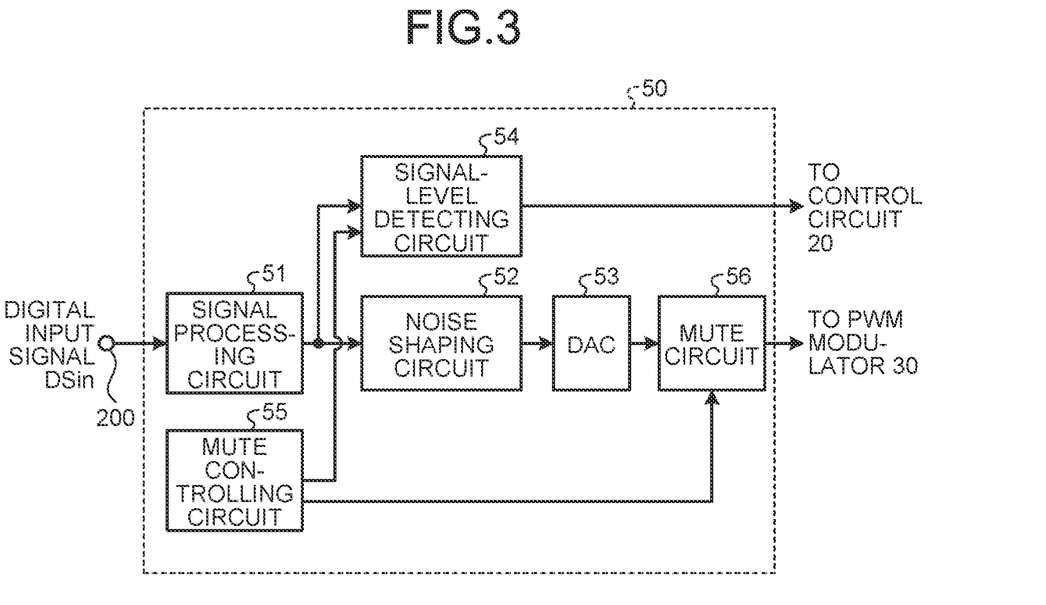
FIG. 3 is a diagram illustrating another embodiment of the audio-signal processing circuit.

FIG. 3 is a diagram illustrating another embodiment of the audio-signal processing circuit 50. The audio-signal processing circuit 50 according to the present embodiment further includes a mute controlling circuit 55 and a mute circuit 56. The mute controlling circuit 55 controls the mute circuit 56. When executing control for turning ON the mute circuit 56 so as to shift to a mute state, the mute controlling circuit 55 supplies information thereon to the signal-level detecting circuit 54.

When a signal level from the signal processing circuit 51 is smaller than a predetermined threshold value and when a signal indicating a state having shifted to a mute state is supplied from the mute controlling circuit 55, the signal-level detecting circuit 54 generates a signal of an L level indicating a small-signal state, and supplies the generated signal to the control circuit 20. When the mute circuit 56 operates, the drive circuit 10 is switched into an operation corresponding to that at a time of a small signal, so as to switch into a configuration for reducing power consumption. In addition to a case of a small signal, also in a case of a mute operation, the control for effectively reducing power consumption is able to be performed.

Figure 4:
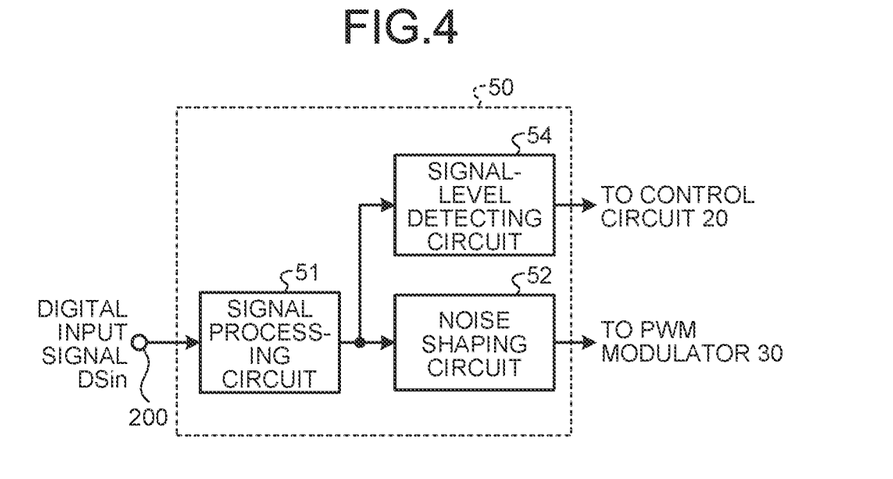
FIG. 4 is a diagram illustrating another embodiment of the audio-signal processing circuit.

FIG. 4 is a diagram illustrating another embodiment of the audio-signal processing circuit 50. In the audio-signal processing circuit 50 according to the present embodiment, output from the noise shaping circuit 52 is supplied to the PWM modulator 30. The PWM modulator 30 may be configured to generate a PWM signal whose ON-duty is adjusted in accordance with a digital signal output from the noise shaping circuit 52. The signal-level detecting circuit 54 detects a peak value of a supplied signal level, and compares the detected value with a predetermined threshold value. When the supplied signal level is smaller than the threshold value, a signal of an L level indicating a small-signal state is generated, and the generated signal is supplied to the control circuit 20. When the supplied signal level is larger than the threshold value, a signal of an H level is generated, and the generated signal is supplied to the control circuit 20.

Second Embodiment

Figure 5:
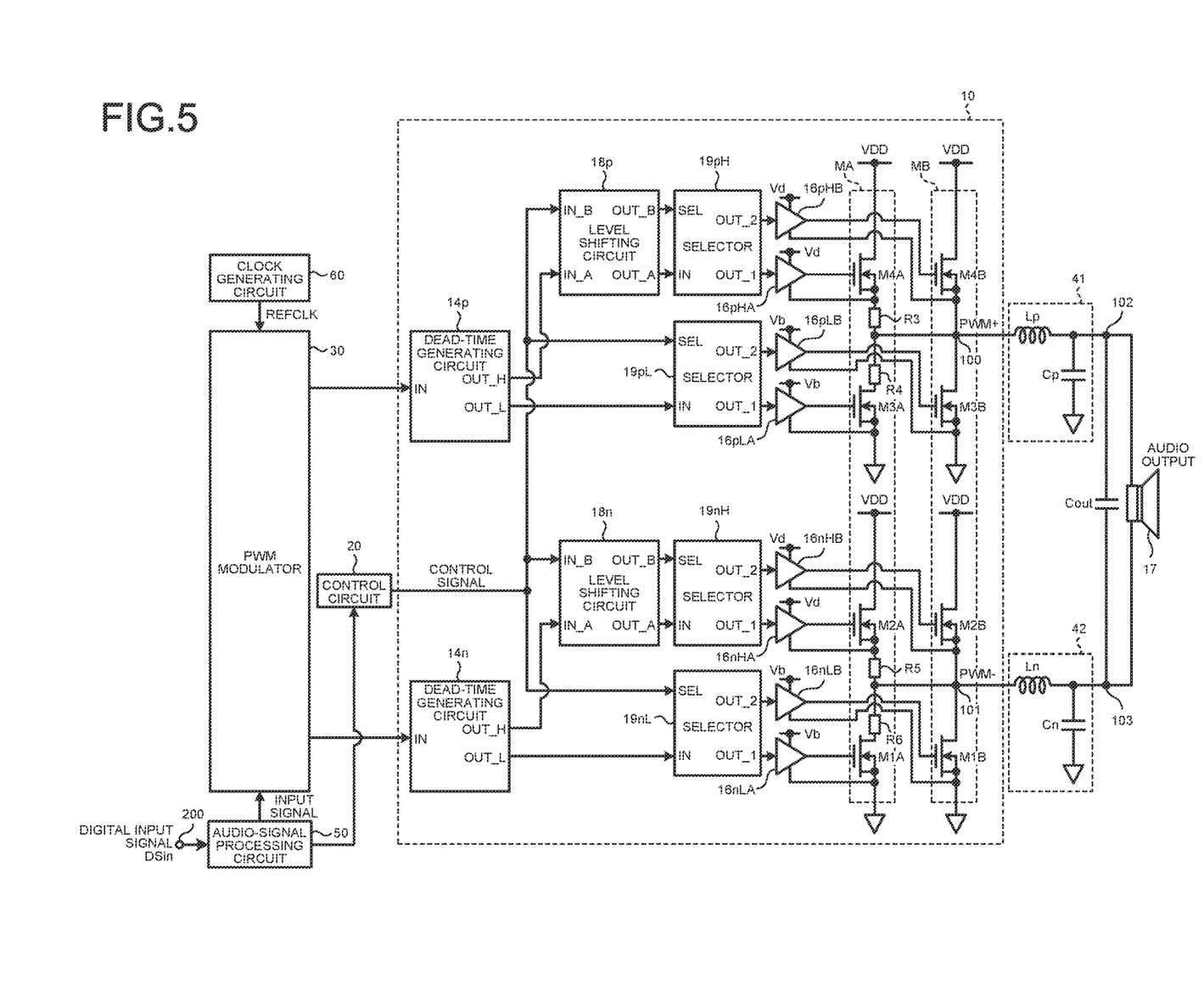
FIG. 5 is a diagram illustrating a configuration of a class-D amplifier according to a second embodiment.

FIG. 5 is a diagram illustrating a configuration of a class-D amplifier according to a second embodiment. Configurations corresponding to the above-mentioned embodiment are provided with the same reference symbols, and duplicated explanation is appropriately omitted. The same applies hereafter. In the present embodiment, there is provided resistance elements R3 and R4 that are connected in series with a source/drain path that is a main current path of the output transistors M4A and M3A constituting the first transistor group MA. Similarly, there is provided resistance elements R5 and R6 that are connected in series with source/drain paths that are main current paths of the output transistors M2A and M1A constituting the first transistor group MA.

According to the present embodiment, charge and discharge current between the first transistor group MA and the low-pass filters 41 and 42 is reduced by the resistance elements R3, R4, R5, and R6. Thus, it is possible to effectively reduce loss of electric power at a time of a small signal. Between a power-source end to which a power-source voltage VDD is applied and the ground, the resistance elements R3 and R4 are connected in series with main current paths of the output transistors M3A and M4A, and the resistance elements R5 and R6 are connected in series with main current paths of the output transistors M1A and M2A. Thus, the resistance elements R3 and R4 reduce flow-through current when the output transistors M4A and M3A are simultaneously turned ON by Self Turn-On and the like. The resistance elements R5 and R6 are capable of reducing flow-through current when the output transistors M2A and M1A are simultaneously turned ON.

Third Embodiment

Figure 6:
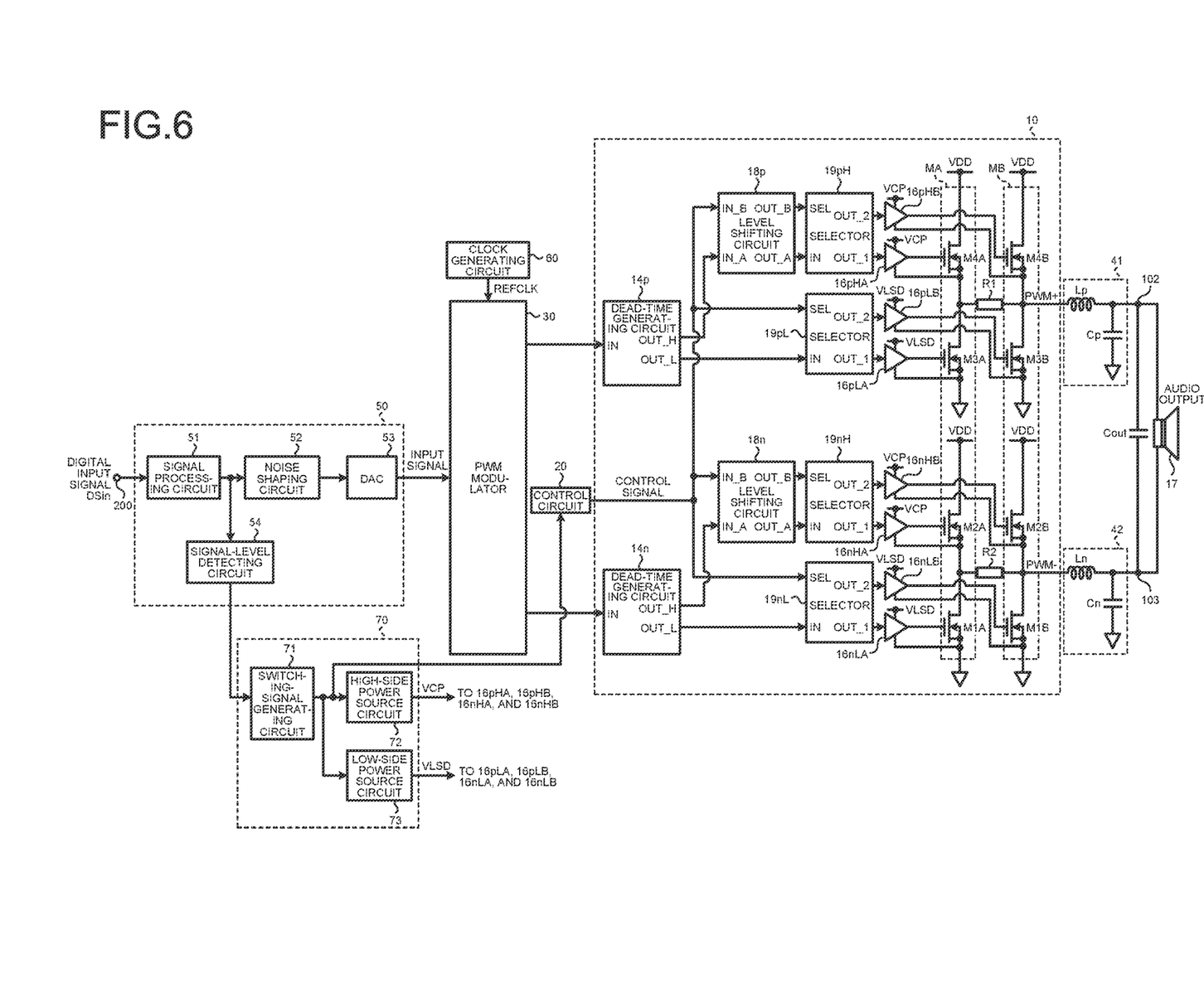
FIG. 6 is a diagram illustrating a configuration of a class-D amplifier according to a third embodiment.

FIG. 6 is a diagram illustrating a configuration of a class-D amplifier according to a third embodiment. The class-D amplifier according to the present embodiment further includes a variable power source circuit 70. The variable power source circuit 70 includes a switching-signal generating circuit 71, a high-side power source circuit 72, and a low-side power source circuit 73. The high-side power source circuit 72 supplies a bias voltage VCP to bias power source ends of the high-side gate drivers 16$p$HA, 16$p$HB, 16$n$HA, and 16$n$HB. The low-side power source circuit 73 supplies a bias voltage VLSD to bias power source ends of the low-side gate drivers 16$p$LA, 16$p$LB, 16$n$LA, and 16$n$LB.

In response to an output signal from the switching-signal generating circuit 71, the high-side power source circuit 72 and the low-side power source circuit 73 adjust voltage values of the bias voltages VCP and VLSD. When an output signal of the signal-level detecting circuit 54 is an H level, the switching-signal generating circuit 71 raises the bias voltages VCP and VLSD to be output from the high-side power source circuit 72 and the low-side power source circuit 73. In other words, the bias voltages VCP and VLSD are switched into high voltages. According to the above-mentioned control, a signal level rises, which is applied to a gate of each of the output transistors M1B to M4B from corresponding one of the gate drivers 16$p$HB, 16$p$LB, 16$n$HB, and 16$n$LB. Thus, it is possible to reduce an ON resistance of each of the output transistors. In other words, power consumption by an ON resistance of each of the output transistors M1B to M4B is able to be reduced, which is dominant in an operation state when an input-signal level is large, so that it is possible to effectively reduce loss of electric power.

When an output signal from the signal-level detecting circuit 54 is an L level, the switching-signal generating circuit 71 drops the bias voltages VCP and VLSD output from the high-side power source circuit 72 and the low-side power source circuit 73. When a voltage to be applied to a gate of each of the output transistors M1A to M4A is dropped, loss of electric power due to charge and discharge current with respect to gate capacities of the output transistors M1A to M4A is able to be reduced. Also, charge and discharge current between the first transistor group MA and the low-pass filters 41 and 42 is effectively reduced by the resistance elements R1 and R2. The high-side power source circuit 72 may be constituted of a charge pump power source circuit, for example. The low-side power source circuit 73 may be constituted of a voltage regulator circuit, for example.

In the present embodiment, power consumption at a time of the small-signal mode is reduced by the resistance elements R1 and R2, and further the bias voltages VCP and VLSD to be applied to the gate drivers 16$p$HA, 16$p$LA, 16$n$HA, and 16$n$LA are dropped so as to reduce charge and discharge current of a gate capacity of each of the output transistors. In the large-signal mode, there is executed control for raising the bias voltages VCP and VLSD to be applied to the gate drivers 16$p$HB, 16$p$LB, 16$n$HB, and 16$n$LB so as to reduce an ON resistance of each of the output transistors, and for reducing power consumption due to the ON resistance. According to the above-mentioned control, it is possible to effectively reduce loss of electric power in the large-signal mode.

There may be configured to increase the number of settings of level adjustment of the bias voltages VCP and VLSD, and further to execute subdivided adjustment in accordance with a signal level of an input signal. The bias voltages VCP and VLSD are adjusted in multi-stages in accordance with a signal level detected by the signal-level detecting circuit 54, and thus there are adjusted loss of electric power due to charge and discharge current caused by gate capacity of the output transistors M1A to M4A and M1B to M4B, and loss of electric power due to ON resistances of the output transistors. Thus, it is possible to optimize adjustment of power consumption. The control is caused by adjustment of a bias voltage performed by the variable power source circuit 70, and thus it is possible to perform multistage adjustment without increase in a size of the circuit. A signal level for switching between the output transistor groups MA and MB and a signal level for switching between the bias voltages VCP and VLSD, which are determined by the signal-level detecting circuit 54, may be different from each other.

Fourth Embodiment

Figure 7:
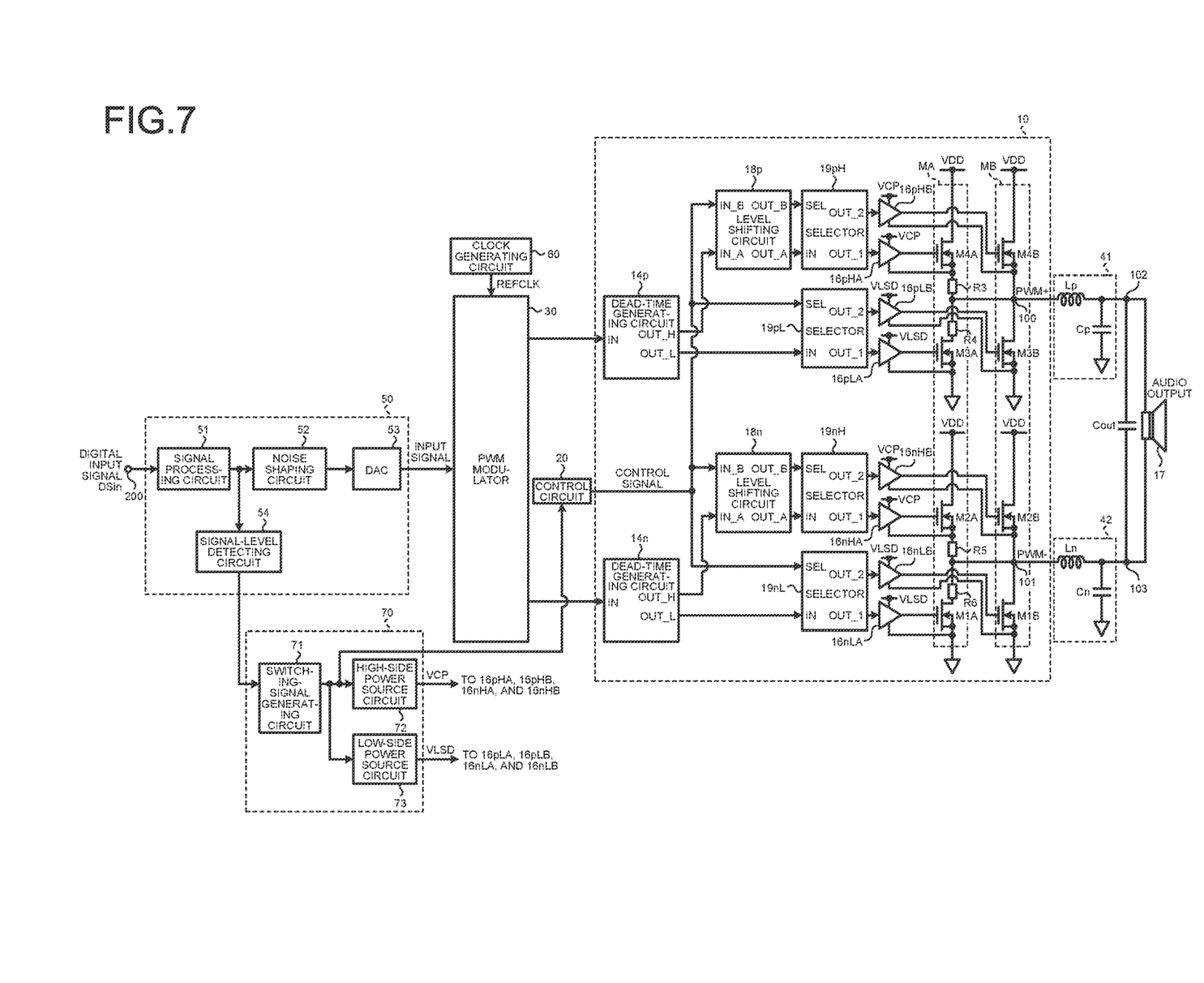
FIG. 7 is a diagram illustrating a configuration of a class-D amplifier according to a fourth embodiment.

FIG. 7 is a diagram illustrating a configuration of a class-D amplifier according to a fourth embodiment. In the present embodiment, there is configured to further include the variable power source circuit 70 in addition to the configuration according to the second embodiment. In the present embodiment, when a signal level is the small-signal mode, the first transistor group MA operates, charge current to the low-pass filters 41 and 42 and discharge current from the low-pass filters 41 and 42 are effectively reduced by the resistance elements R3 to R6. In the large-signal mode, there is executed control for raising the bias voltages VCP and VLSD so as to reduce ON resistances of the output transistors M1B to M4B, so that it is possible to effectively reduce power consumption. The resistance elements R3 to R6 effectively reduce flow-through current.

Fifth Embodiment

Figure 8:
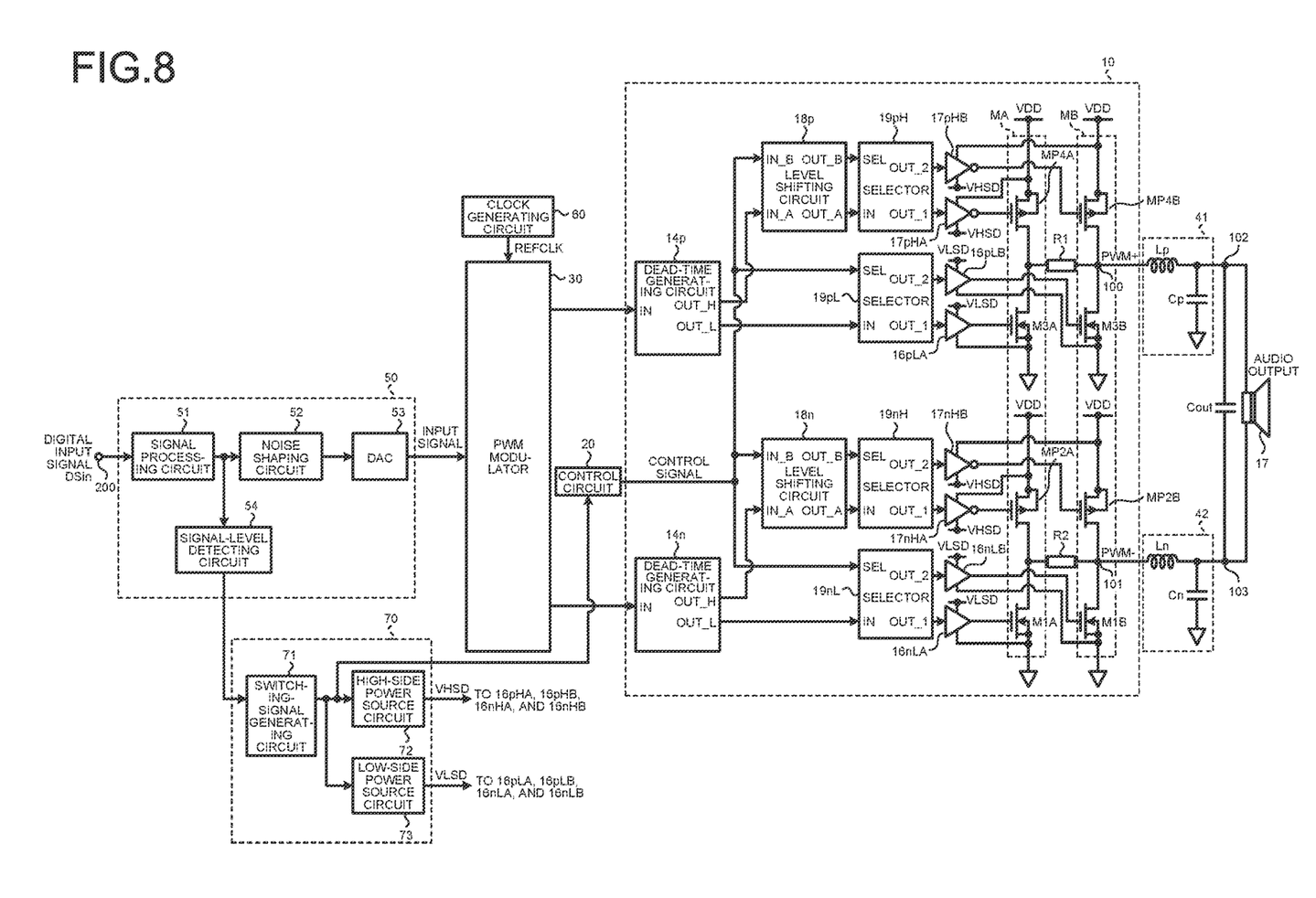
FIG. 8 is a diagram illustrating a configuration of a class-D amplifier according to a fifth embodiment.

FIG. 8 is a diagram illustrating a configuration of a class-D amplifier according to a fifth embodiment. In the present embodiment, output transistors MP2A, MP2B, MP4A, and MP4B are constituted of p-channel MOS transistors. Source voltages of the output transistors MP2A, MP2B, MP4A, and MP4B are the power-source voltage VDD, and thus when a voltage is supplied that is lower than the power-source voltage VDD by a predetermined threshold value, each of the output transistors MP2A, MP2B, MP4A, and MP4B is able to be turned ON. In other words, with reference to the power-source voltage VDD, setting and adjustment are able to be performed on a voltage to be applied to a gate of each of the output transistor MP2A, MP2B, MP4A, and MP4B. Thus, a configuration for voltage adjustment using the variable power source circuit 70 becomes easy, so that it is possible to simplify a configuration of the high-side power source circuit 72.

Gate drivers 17pHA, 17pHB, 17nHA, and 17nHB are able to be easily constituted of an inverter circuit. In the large-signal mode, when executing control for dropping a bias voltage VHSD under control for operating the second transistor group MB, a voltage to be applied to between a gate and a source of each of the output transistors MP2B and MP4B is raised so as to drop an ON resistance, so that it is possible to reduce loss of electric power. Moreover, when executing, in the small-signal mode, control for dropping the bias voltage VLSD in response to an output signal from the switching-signal generating circuit 71, charge and discharge current to gate capacities of the output transistors M1A and M3A is able to be reduced, so that it is possible to reduce loss of electric power.

In the above-mentioned embodiments, there has been explained the configuration in which control for switching between the small-signal mode and the large-signal mode is executed in accordance with a level of an input signal; however, there may be employed a configuration in which a clipping state of a PWM output in the positive phase output end 100 and the reversed phase output end 101 is detected to execute switching between the small-signal mode and the large-signal mode. There may be employed a configuration in which similar control is executed while associating, with the large-signal mode, a case where a PWM output in the positive phase output end 100 and the reversed phase output end 101 becomes a clipping state.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A class-D amplifier comprising:
   a PWM modulator that outputs a PWM modulation signal in response to an input signal;
   a drive circuit that amplifies the PWM modulation signal, and outputs an amplified PWM modulation signal; and
   an output end to which the amplified PWM modulation signal from the drive circuit is supplied, wherein
   the drive circuit includes:
      a first output transistor whose main current path is connected between a power source supplying end and the output end;
      a second output transistor having a size larger than a size of the first output transistor and whose main current path is connected between the power source supplying end and the output end; and
      a resistance element that is connected between the main current path of the first output transistor and the output end, and
   the class-D amplifier further comprising:
   a signal-level detecting circuit that detects a signal level of the input signal; and
   a control circuit that selects, in accordance with a level of the input signal, one from among the first output transistor and the second output transistor, and causes the selected one to operate.

2. The class-D amplifier according to claim 1 further comprising:
   a first gate driver that supplies the PWM modulation signal to the first output transistor;
   a second gate driver that supplies the PWM modulation signal to the second output transistor; and
   a variable power source circuit that adjusts, in accordance with a level of the input signal, a bias voltage applied to the first gate driver and the second gate driver.

3. The class-D amplifier according to claim 2, wherein when causing the second output transistor to operate, the variable power source circuit raises the bias voltage.

4. The class-D amplifier according to claim 1 further comprising:
a third output transistor whose main current path is connected in serial between the first output transistor and a ground.

5. The class-D amplifier according to claim 4, wherein the first output transistor and the third output transistor complementarily operate.

6. The class-D amplifier according to claim 4, wherein the first output transistor includes a P-channel MOS transistor; and
the third output transistor includes an N-channel MOS transistor.

7. The class-D amplifier according to claim 6, wherein when causing the second output transistor to operate, the variable power source circuit drops the bias voltage.

8. The class-D amplifier according to claim 1, wherein the signal-level detecting circuit detects a peak value of the input signal.

9. The class-D amplifier according to claim 1 further comprising:
a mute controlling circuit that shifts the class-D amplifier into a mute state, wherein
when the mute controlling circuit shifts the class-D amplifier into the mute state, the control circuit selects and causes the first output transistor to operate.

10. A class-D amplifier comprising:
a PWM modulator that outputs a PWM modulation signal in response to an input signal; and
a drive circuit that amplifies the PWM modulation signal, and outputs an amplified PWM modulation signal, wherein
the drive circuit includes:
a first output transistor, one end of a main current path of the first output transistor being connected to a power source supplying end;
a second output transistor including a main current path, one end of the main current path of the second output transistor being connected to another end of the main current path of the first output transistor, and another end of the main current path of the second output transistor being grounded;
a third output transistor having a size larger than a size of the first output transistor, and including a main current path, one end of the main current path of the third output transistor being connected to the power source supplying end, and another end of the main current path of the third output transistor being connected to an output end;
a fourth output transistor having a size larger than a size of the second output transistor, and including a main current path, one end of the main current path of the fourth output transistor being connected to the output end, and another end of the main current path of the fourth output transistor being grounded; and
a resistance element that is connected between the other end of the main current path of the first output transistor and the other end of the main current path of the third output transistor, and
the class-D amplifier further comprising:
a signal-level detecting circuit that detects a signal level of the input signal; and
a control circuit that selects, in accordance with a level of the input signal, one from among the first output transistor and the third output transistor, and causes the selected one to operate.

11. The class-D amplifier according to claim 10 further comprising:
a first gate driver that supplies the PWM modulation signal to the first output transistor;
a second gate driver that supplies the PWM modulation signal to the third output transistor; and
a variable power source circuit that adjusts, in accordance with a level of the input signal, a bias voltage applied to the first gate driver and the second gate driver.

12. The class-D amplifier according to claim 11, wherein when causing the third output transistor to operate, the variable power source circuit raises the bias voltage.

13. The class-D amplifier according to claim 10, wherein the first output transistor and the third output transistor include a P-channel MOS transistor, and
the second output transistor and the fourth output transistor include an N-channel MOS transistor.

14. The class-D amplifier according to claim 13, wherein when causing the third output transistor to operate, the variable power source circuit drops the bias voltage.

15. A class-D amplifier comprising:
a PWM modulator that outputs a PWM modulation signal in response to an input signal; and
a drive circuit that amplifies the PWM modulation signal, and outputs an amplified PWM modulation signal, wherein
the drive circuit includes:
a first output transistor, one end of a main current path of the first output transistor being connected to a power source supplying end;
a first resistance element, one end of the first resistance element being connected to another end of the main current path of the first output transistor, and another end of the first resistance element connected to an output end;
a second output transistor, one end of a main current path of the second output transistor being grounded;
a second resistance element, one end of the second resistance element being connected to another end of the main current path of the second output transistor, and another end of the second resistance element connected to the output end;
a third output transistor having a size larger than a size of the first output transistor, and including a main current path, one end of the main current path of the third output transistor being connected to the power source supplying end, and another end of the main current path of the third output transistor being connected to the output end; and
a fourth output transistor having a size larger than a size of the second output transistor, and including a main current path, one end of the main current path of the fourth output transistor being connected to the output end, and another end of the main current path of the fourth output transistor being grounded, and
the class-D amplifier further comprising:
a signal-level detecting circuit that detects a signal level of the input signal; and
a control circuit that selects, in accordance with a level of the input signal, one from among the first output transistor and the third output transistor, and causes the selected one to operate.

16. The class-D amplifier according to claim 15 further comprising:
- a first gate driver that supplies the PWM modulation signal to the first output transistor;
- a second gate driver that supplies the PWM modulation signal to the third output transistor; and
- a variable power source circuit that adjusts, in accordance with a level of the input signal, a bias voltage applied to the first gate driver and the second gate driver.

17. The class-D amplifier according to claim 16, wherein when causing the third output transistor to operate, the variable power source circuit raises the bias voltage.

* * * * *